United States Patent
Tailliet

(10) Patent No.: US 8,755,156 B2
(45) Date of Patent: Jun. 17, 2014

(54) STRUCTURE OF PROTECTION OF AN INTEGRATED CIRCUIT AGAINST ELECTROSTATIC DISCHARGES

(75) Inventor: François Tailliet, Fuveau (FR)

(73) Assignee: STMicroelectronics (Rousset) SAS, Rousset (FR)

(*) Notice: Subject to any disclaimer, the term of this patent is extended or adjusted under 35 U.S.C. 154(b) by 205 days.

(21) Appl. No.: 13/012,220

(22) Filed: Jan. 24, 2011

(65) Prior Publication Data

US 2011/0181991 A1    Jul. 28, 2011

(30) Foreign Application Priority Data

Jan. 26, 2010 (FR) .................................... 10 50493

(51) Int. Cl.
*H02H 9/00* (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| | | | | |
|---|---|---|---|---|
| 3,762,907 A | * | 10/1973 | Quinn et al. ..................... | 65/164 |
| 5,473,169 A | * | 12/1995 | Ker et al. ....................... | 257/173 |
| 5,670,799 A | * | 9/1997 | Croft .............................. | 257/173 |
| 6,577,480 B1 | * | 6/2003 | Avery et al. ..................... | 361/56 |
| 6,919,602 B2 | * | 7/2005 | Lin et al. ......................... | 257/360 |
| 7,164,565 B2 | * | 1/2007 | Takeda ............................. | 361/56 |
| 7,548,401 B2 | * | 6/2009 | Mergens et al. ................. | 361/56 |
| 2002/0089017 A1 | * | 7/2002 | Lai et al. ......................... | 257/355 |
| 2004/0027742 A1 | * | 2/2004 | Miller et al. .................... | 361/52 |
| 2005/0110556 A1 | * | 5/2005 | Guedon .......................... | 327/390 |
| 2008/0055804 A1 | * | 3/2008 | Van Camp ....................... | 361/56 |

FOREIGN PATENT DOCUMENTS

| | | | |
|---|---|---|---|
| WO | WO 2006033993 A1 | 3/2006 | |
| WO | WO 2007/007237 A2 * | 1/2007 | ............. H01L 27/02 |
| WO | WO 2007007237 A2 | 1/2007 | |

OTHER PUBLICATIONS

French Search Report dated Aug. 10, 2010 from corresponding French Application No. 10/50493.

* cited by examiner

*Primary Examiner* — Jared Fureman
*Assistant Examiner* — Kevin J Comber
(74) *Attorney, Agent, or Firm* — Wolf, Greenfield & Sacks, P.C.

(57) ABSTRACT

An integrated circuit protected against electrostatic discharges, including input/output pads and first and second power supply rails, and: a thyristor forward-connected between each input/output pad and the second rail, each thyristor including, between its anode gate and its anode, a resistor; between each thyristor and the first rail, a diode having its anode connected to the anode gate of the thyristor and having its cathode connected to the first rail via a resistor for adjusting the triggering; and a triggering device capable of conducting a current between the first and second rails when a positive overvoltage occurs between these rails.

22 Claims, 2 Drawing Sheets

STRUCTURE OF PROTECTION OF AN INTEGRATED CIRCUIT AGAINST ELECTROSTATIC DISCHARGES

CROSS REFERENCE TO RELATED APPLICATIONS

This application claims the priority benefit of French patent application number 10/50493, filed on Jan. 26, 2010, entitled "Structure of Protection of an Integrated Circuit Against Electrostatic Discharges," which is hereby incorporated by reference to the maximum extent allowable by law.

BACKGROUND OF THE INVENTION

1. Field of the Invention

The present invention relates to the protection of integrated circuits against electrostatic discharges.

2. Discussion of the Related Art

An integrated circuit comprises metal pads intended to provide connections to the outside. Some of the pads are capable of receiving power supply voltages. The other pads are capable of receiving and/or of providing input-output signals. Power supply rails, connected to the supply pads, are generally provided all around the circuit to power its different components. Generally, an insulating layer covers the circuit, only leaving access to the metal pads.

Such a circuit generally receives and/or provides signals of low voltage level (for example, from 1 to 5 V) and of low current intensity (for example, from 1 µA to 10 mA), and is capable of being damaged when overvoltages or overcurrents occur between circuit pads.

It is thus provided to associate a protection structure with each pad. The protection structure should be able to rapidly carry off significant currents, likely to appear when an electrostatic discharge occurs between two pads of the circuit.

FIGS. 1, 2A, and 3A show three input/output pads IO1 to IO3 and a high power supply pad $V_{DD}$ of an integrated circuit. Each pad is coupled with a protection structure connecting the pad to a ground terminal (GND) of the circuit. "Ground" designates, here and in the following description, a reference voltage common to various components of the integrated circuit, for example, a low power supply voltage. The ground connections can be performed via a ground rail, or low power supply rail, this rail being connected to a pad, accessible outside of the circuit and capable of being set to the selected reference voltage.

In FIG. 1, each pad is coupled with a protection structure 1 comprising an NPN-type bipolar transistor 5 having its collector C and its emitter E respectively connected to the pad and to ground, and having its base B grounded via a resistor $R_0$.

To enable to drain off the current between two pads of the circuit, each protection structure 1 associated with a pad should be able to remove overvoltages between the pad and the ground, whatever the biasing (positive or negative) of the overvoltage.

In case of a negative overvoltage between a pad and the ground, the base-collector PN junction of transistor 5 associated with the concerned pad, forward biased, becomes conductive, and the overvoltage is removed.

In case of a positive overvoltage between the pad and the ground, the base-collector junction of transistor 5, reverse biased, becomes conductive by avalanche effect, and the current flows towards the ground, through resistor $R_0$. As soon as the voltage across resistor $R_0$ reaches a given threshold, the base-emitter PN junction, forward biased, becomes conductive, and the overvoltage is removed.

A disadvantage of protection structures with bipolar transistors is that, in the case of a positive overvoltage between a pad and the ground, they have a poorly controlled trigger voltage (breakover voltage of the base-collector junction). Thus, there is a risk for components of the integrated circuit to be destroyed before the protection starts operating. Further, to withstand the power dissipated in an electrostatic discharge, bipolar transistors 5 should have large dimensions, which poses problems in terms of silicon surface area and stray capacitances.

FIG. 2A shows a protection structure with Shockley diodes. Each pad is coupled with a Shockley diode 11 forward-connected between the pad and the ground.

FIG. 2B shows an equivalent electric diagram of a Shockley diode, or thyristor with no gate terminal. In this thyristor, the cathode gate region is connected to the cathode. To enable the reverse conduction of the structure, a resistor Rs is provided between the anode gate region and the thyristor anode.

In case of a negative overvoltage between a pad and the ground, the PN junction between the cathode gate region and the anode gate region, forward biased, becomes conductive and the overvoltage is removed through resistor Rs.

In case of a positive overvoltage between the pad and the ground, the thyristor becomes conductive by breakover of the PN junction formed between its cathode gate and anode gate regions, and the overvoltage is removed.

An advantage of protection structures with thyristors is that they have much greater overvoltage removal performances than structures with bipolar transistors. This is especially due to the very low voltage remaining across the thyristor, when the latter is made forward conductive. For equivalent overvoltage removal possibilities, the dimensions of thyristor protection structure 11 of FIGS. 2A and 2B are much smaller than the dimensions of bipolar transistor protection structure 1 of FIG. 1. As a result, protection structures with a thyristor generate much smaller stray capacitances than bipolar transistor protection structures.

However, in the same way as for protection structures with bipolar transistors, a disadvantage of protection structures with thyristors of the type described in relation with FIGS. 2A and 2B is that they have a poorly controlled trigger voltage (breakover voltage of the Shockley diode). Further, since the semiconductor areas forming the diodes are formed of doped regions provided to optimize the active components of the integrated circuit, it is difficult to obtain optimal breakover voltages and too high break over voltages result being obtained. Thus, there is a risk for components of the integrated circuit to be destroyed before the protection starts operating.

FIG. 3A shows another example of a structure of protection against electrostatic discharges. In this structure, diodes 21 are forward-connected between each input-output pad (IO1, IO2, IO3) and a high power supply rail 20 connected to pad $V_{DD}$. Diodes 23 are reverse-connected between each input/output pad and the ground (GND). In the vicinity of each pad, a MOS transistor 25, used as a switch, is connected between high power supply rail 20 and the ground. With each transistor 25 is associated an overvoltage detection circuit 27, connected in parallel with transistor 25, and capable of providing this transistor with a triggering signal. Each MOS transistor 25 comprises a parasitic diode 26, forward-connected between the ground and high power supply rail 20.

In normal operation, when the chip is powered, the ground voltage and the signals on the input/pads and on high power supply rail 20 are such that diodes 21 and 23 conduct no current. Further, detection circuits 27 make MOS transistors 25 non-conductive.

In case of a positive overvoltage between pad $V_{DD}$ and the ground, circuits 27 turn on transistors 25, which enables to remove the overvoltage.

In case of a negative overvoltage between pad $V_{DD}$ and the ground, parasitic diodes 26 of transistors 25 become conductive and the overvoltage is removed through these diodes.

In case of a positive overvoltage between an input/output pad and pad $V_{DD}$, diode 21 associated with the concerned input/output pad becomes conductive, which enables to remove the overvoltage.

In case of a negative overvoltage between an input/output pad and pad $V_{DD}$, circuits 27 turn on transistors 25, and the overvoltage is removed through transistors 25 and through diode 23 associated with the concerned input/output pad.

In case of a positive overvoltage between an input/output pad and the ground, diode 21 associated with the concerned pad becomes conductive and the positive overvoltage is transferred onto high power supply rail 20, which corresponds to the above case of a positive overvoltage between pad $V_{DD}$ and the ground.

In case of a negative overvoltage between an input/output pad and the ground, diode 23 associated with the concerned pad becomes conductive, which enables removing the overvoltage.

In case of a positive or negative overvoltage between two input/output pads, diodes 21 or 23 associated with the concerned pads become conductive, and the overvoltage is transferred between high power supply rail 20 and the ground, which corresponds to one of the above overvoltage cases.

FIG. 3B shows in further detail a possible embodiment of a circuit 27 for detecting a positive overvoltage between high power supply rail 20 and the ground (GND), and for controlling a MOS protection transistor 25. An edge detector, formed of a resistor 31 in series with a capacitor 33, is connected between high power supply rail 20 and the ground. Node M between resistor 31 and capacitance 33 is connected to the gate of a P-channel MOS transistor 35 having its source connected to high power supply rail 20 and having its drain grounded via a resistor 37. Node N between the drain of transistor 35 and resistor 37 is connected to the gate of protection transistor 25. An assembly 39 of diodes in series is forward-connected between node M and the ground. In this example, assembly 39 comprises four diodes in series.

In normal operation, when the circuit is powered, node M is at a high state. P-channel MOS transistor 35 is thus off. Thus, gate node N of transistor 25 is at a low state, maintaining this transistor off. When the voltage difference between high power supply rail 20 and the ground increases, the voltage at node M also increases. When the voltage at node M reaches a given threshold, diode assembly 39 becomes conductive. In this example, if each diode has a 0.6-V threshold voltage, assembly 39 turns on when the voltage at node M exceeds 2.4 V. The voltage at node M thus stops increasing, while the voltage of high power supply rail 20 keeps on increasing, which turns on P-channel MOS transistor 35. Thus, gate node N of protection transistor 25 switches to a high state, that is, substantially to the same positive voltage as pad $V_{DD}$. Transistor 25 thus turns on, and the overvoltage is removed.

When the integrated circuit is not powered, node M is in a low state. Since transistor 35 is not powered, node N of this transistor is in an undetermined state. If an abrupt positive overvoltage (fast voltage rise) occurs between pad $V_{DD}$ and the ground, node M remains in a low state. Transistor 35 thus turns on and node N switches to a high state. Thus, protection transistor 25 is turned on, and the overvoltage is removed.

A disadvantage of the protection structure of FIGS. 3A and 3B lies in the fact that, to be able to drain off the currents induced by electrostatic discharges, diodes 21 and 23 and transistors 25 should have a large surface area (for example, a 200-μm junction perimeter per diode 21, 23 and a channel width often greater than 1,000 μm per transistor 25, for example, on the order of from 1,000 to 10,000 μm). As a result, a significant silicon surface area is exclusively dedicated to the protection against electrostatic discharges, to the detriment of the other circuit components. Further, due to their large dimensions, MOS transistors 25 have high stray capacitances, and conduct significant leakage currents in the off state.

Other protection structures comprising a diode coupled to a thyristor have been described in international patent application WO2006/033993 and in US patent US2002/0089017.

SUMMARY OF THE INVENTION

Thus, the present invention aims at providing a structure for protecting an integrated circuit against electrostatic discharges at least partly overcoming some of the disadvantages of prior art solutions.

Thus, an embodiment of the present invention provides an integrated circuit protected against electrostatic discharges, comprising input/output pads and first and second power supply rails, and: a thyristor, forward-connected between each input/output pad and the second rail, each thyristor comprising, between its anode gate and its anode, a resistor; between each thyristor and the first rail, a diode having its anode connected to the anode gate of the thyristor and having its cathode connected to the first rail via a resistor for adjusting the triggering; and a triggering device capable of letting through a current between the first and second rails when a positive overvoltage occurs between these rails.

According to an embodiment of the present invention, the triggering device comprises an N-channel MOS transistor having its drain connected to the first rail and having its source connected to the second rail, and an overvoltage detection circuit capable of providing a triggering signal to this transistor.

According to an embodiment of the present invention, the overvoltage detection circuit comprises: an edge detector formed of a resistor in series with a capacitor connected between the first and second power supply rails; a P-channel MOS transistor having its source connected to the first rail and having its drain connected to the second rail via a resistor, the gate of this transistor being connected to the node between the resistor and the capacitor of the edge detector, and the gate of the N-channel MOS transistor being connected to the drain of the P-channel MOS transistor; and an assembly of diodes in series forward-connected between the gate of the P-channel MOS transistor and the second power supply rail.

According to an embodiment of the present invention, the triggering device comprises a zener diode reverse-connected between the first and second power supply rails.

According to an embodiment of the present invention, the triggering device comprises an NPN-type bipolar transistor connected between the first and second power supply rails.

According to an embodiment of the present invention, the triggering device also is a protection device capable of draining off overvoltage currents between the first and second power supply rails.

According to an embodiment of the present invention, the resistors for adjusting the triggering associated with separate input/output pads have different values.

The foregoing objects, features, and advantages of the present invention will be discussed in detail in the following non-limiting description of specific embodiments in connection with the accompanying drawings.

DETAILED DESCRIPTION

Figure 4A:
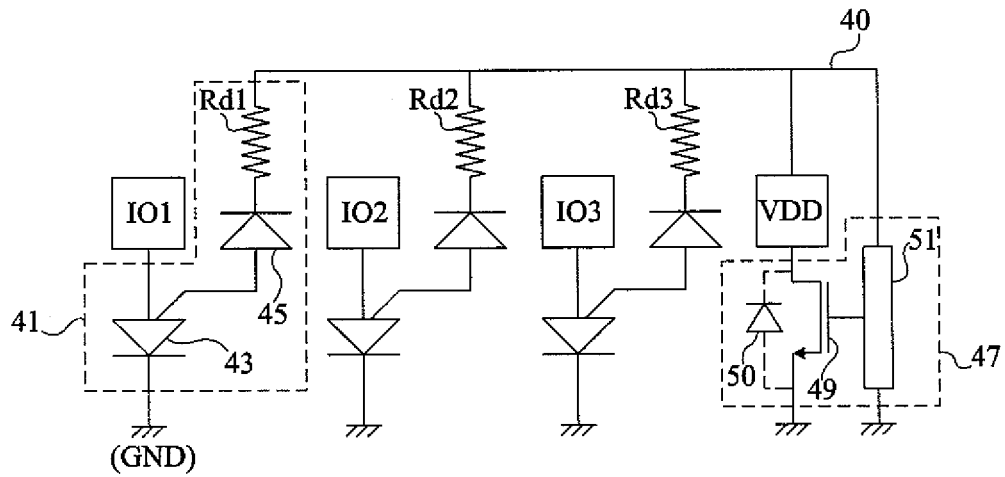
FIG. 4A shows an example of a protection structure associated with pads of an integrated circuit according to an embodiment of the present invention.

FIG. 4A shows three input/output pads IO1 to IO3 and a high power supply pad $V_{DD}$. Each input/output pad is coupled with a protection structure 41 connected between this pad, a ground terminal (GND) of the circuit, and a high power supply rail 40, connected to high power supply pad $V_{DD}$. Each protection structure 41 comprises a thyristor 43, forward-connected between the input/output pad and the ground. The anode gate of thyristor 43 is connected to the anode of a diode 45 having its cathode connected to rail 40 via a resistor Rd1. Separate resistors Rd1, Rd2, Rd3 may be provided for protection structures 41 associated with separate input/output pads IO1, IO2, IO3.

Further, a block 47 is connected between rail 40 (or pad $V_{DD}$) and the ground. In this example, block 47 comprises a MOS transistor 49, used as a switch, connected between rail 40 (or pad $V_{DD}$) and the ground. Block 47 further comprises an overvoltage detection circuit 51, connected in parallel with transistor 49, and capable of providing a triggering signal to this transistor. Circuit 51 may be substantially identical to circuit 27 described in relation with FIG. 3B. MOS transistor 49 comprises a parasitic diode 50 reverse-connected between rail 40 and the ground.

Figure 4B:
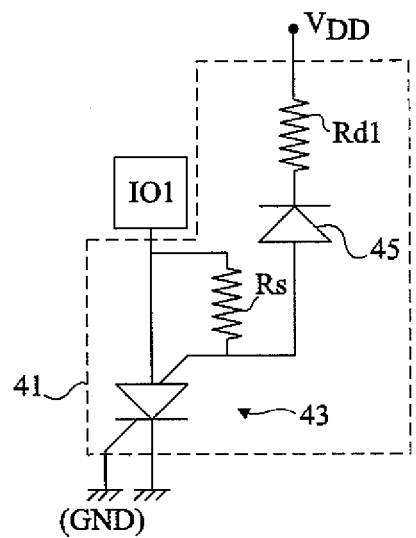
FIG. 4B is a more detailed equivalent electric diagram of an element of the protection structure of FIG. 4A.

FIG. 4B is an equivalent electric diagram of a protection structure 41 of FIG. 4A. The cathode gate region of thyristor 43 is connected to the cathode of thyristor. A resistor Rs connects the anode gate region to the thyristor anode.

The operation of the protection structure will be described hereafter in relation with FIGS. 4A and 4B.

In normal operation, when the chip is powered, the ground voltage (GND) and the signals on the input/output pads and on high power supply rails 40 are such that structures 41 conduct no current. Further, detection circuit 51 makes MOS transistor 49 non conductive.

In case of a positive overvoltage between pad $V_{DD}$ and the ground, circuit 51 turns on transistor 49, which removes the overvoltage.

In case of a negative overvoltage between pad $V_{DD}$ and the ground, parasitic diode 50 of transistor 49 turns on, which removes the overvoltage.

In case of a positive overvoltage between an input/output pad IO1 and the ground, thyristor 43, forward-connected between pad IO1 and the ground, is capable of being turned on. A positive voltage is transferred onto rail 40, through resistor Rs associated with pad IO1, diode 45 associated with pad IO1, and resistor Rd1. Circuit 51 thus makes MOS transistor 49 conductive, and a current flows between pad IO1 and the ground, through resistor Rs, diode 45, resistor Rd1, and transistor 49. When the voltage across resistor Rs reaches a given threshold, the PN junction formed between the anode and the anode gate of thyristor 43 becomes conductive. The threshold voltage of this junction for example is on the order of 0.6 V. A gate current which turns on thyristor 43 thus flows, which removes remove the overvoltage.

In case of a negative overvoltage between input/output pad IO1 and the ground, the PN junction formed between the cathode gate region and the anode gate region of thyristor 43 associated with pad IO1 becomes conductive, and the overvoltage is removed (through resistor Rs).

In case of a positive overvoltage between input/output pad IO1 and pad $V_{DD}$, there is a positive potential difference between pad IO1 and the ground, and thyristor 43, forward-connected between pad IO1 and the ground, is capable of being turned on. A current flows between pad IO1 and pad $V_{DD}$, through resistor Rs associated with pad IO1, diode 45 associated with pad IO1, and resistor Rd1. When the voltage across resistor Rs reaches a given threshold, the PN junction formed between the anode and the anode gate of thyristor 43 becomes conductive. A gate current which turns on thyristor 43 thus flows, which enables to remove the overvoltage through this thyristor and through diode 50.

In case of a negative overvoltage between input/output pad IO1 and pad $V_{DD}$, there is a positive potential difference between pad $V_{DD}$ and the ground. Circuit 51 thus turns on MOS transistor 49, and the positive overvoltage is transferred onto the ground, which corresponds to the above case of a negative overvoltage between pad IO1 and the ground. The overvoltage is thus removed through MOS transistor 49 and the PN junction formed between the cathode gate region and the anode gate region of thyristor 43 associated with pad IO1 (through resistor Rs associated with pad IO1).

To describe the operation of the protection in case of a positive or negative overvoltage between two input/output pads of the circuit, the case of a positive overvoltage between pad IO1 and pad IO2 is considered. There is a positive potential difference between pad IO1 and the ground. Thyristor 43 is forward-connected between pad IO1 and the ground is thus capable of being turned on. A positive voltage is transferred onto rail 40, through resistor Rs associated with pad IO1, diode 45 associated with pad IO1, and resistor Rd1. Circuit 51 thus turns on MOS transistor 49, and a current flows between pad IO1 and pad IO2, through resistor Rs associated with pad IO1, diode 45 associated with pad IO1, resistor Rd1, transistor 49, and through the PN junction formed between the cathode gate region and the anode gate region of thyristor 43 associated with pad IO2 (through resistor Rs associated with pad IO2). When the voltage across resistor Rs associated with pad IO1 reaches a given threshold, the PN junction formed between the anode and the anode gate of thyristor 43 associated with a pad IO1 becomes conductive. A gate current which turns on this thyristor thus flows. Thus, the overvoltage is removed through thyristor 43 associated with pad IO1 and through the PN junction formed between the cathode gate region and the anode gate region of thyristor 43 associated with pad IO2 (through resistor Rs associated with pad IO2).

It should be noted that in practice, thyristors are often formed in association with a bulk diode (not shown), forward-connected between the cathode and the anode of the thyristor. This diode offers a path to positive currents from ground to pad.

Thus, the provided protection structure enables removing any type of overvoltage capable of occurring between two pads of an integrated circuit.

It should be noted that in some circuits, it is not necessary to provide an overvoltage removal path between the high power supply rail and the ground. Such is, for example, the case for some RF-type circuits, where the high power supply rail is not connected to a pad accessible from outside of the circuit. In this case, the dimensions of MOS transistor 49 may be considerably decreased. Indeed, in such a circuit, when an overvoltage occurs on an input/output pad, only a small part of the overvoltage transits through MOS transistor 49, to enable the flowing of a current for triggering thyristor 43 associated with the concerned pad.

According to an alternative embodiment of the provided structure, a triggering or triggering and protection element, other than block 47 with MOS transistors of FIG. 4A, may be provided between pad $V_{DD}$ and the ground. The triggering or triggering and protection element may for example be a zener diode, reverse-connected between pad $V_{DD}$ and the ground, and capable of conducting in forward mode, in case of a negative overvoltage between $V_{DD}$ and the ground and, in reverse mode, by avalanche effect, in case of a positive overvoltage between $V_{DD}$ and the ground. The triggering or triggering and protection element between $V_{DD}$ and the ground may also be an NPN-type bipolar transistor.

Figure 2A:
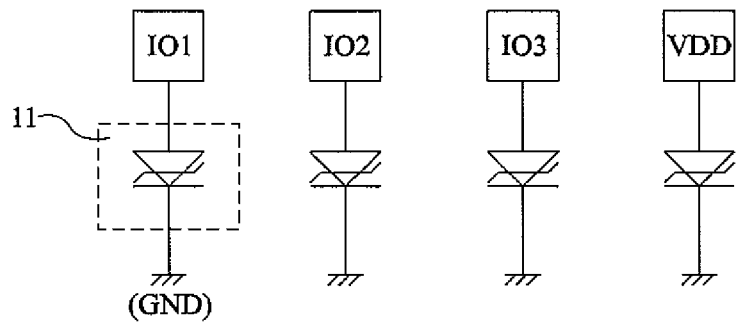
FIG. 2A, previously described, shows the electric diagram of a protection based on Shockley diodes.
Figure 2B:
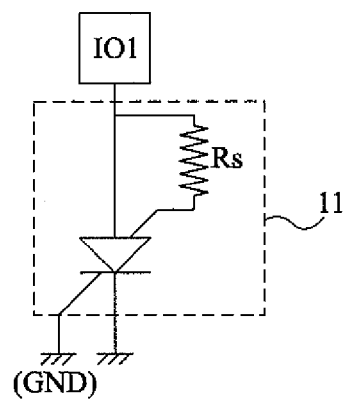
FIG. 2B, previously described, is a more detailed electric diagram of the protections structure of FIG. 2A.

An advantage of the provided protection structure over protection structures with an uncontrolled thyristor (Shockley diode), of the type described in relation with FIGS. 2A and 2B, is that it enables selecting the voltage level at which the protection is desired to be triggered. This voltage level is especially determined, on the one hand, by the sensitivity of overvoltage detection circuit 51 and, on the other hand, by the value of resistors Rs, Rd1, Rd2, Rd3, associated with the input/output pads. The higher the values of resistors Rd1, Rd2, Rd3 with respect to Rs, the higher the triggering threshold of the protection (because the conductivity threshold of the junction formed between the anode and the anode gate of the thyristor is reached later). The value of resistor Rs can be from about several tens to several hundreds ohms, for example from 10 to 150 ohms, and the values of resistors Rd can be of about several hundreds ohms or more, for example from 200 to 800 ohms. It should be noted that resistors Rd have much higher values than intrinsic parasitic resistors, from about several ohms to several tens ohms, generally existing in overvoltage removal path of protection structures.

For a given input/output pad $IO_i$, the voltage level at which the thyristor is triggered is $VIO_i = V_{DD} + V_{th}*(1+Rd_i/Rs)$, $V_{th}$ being the threshold voltage of the PN junction between the anode and the anode gate of the thyristor. The current for triggering the thyristor is $I=(VIO_i-V_{DD})/(R+Rs)$, with $Rs*I=V_{th}$.

If the triggering element provided between $V_{DD}$ and the ground is a zener diode, an NPN-type bipolar transistor, or any other adapted element, the voltage level at which the protection is triggered will be linked to the sensitivity of this element.

It should in particular be noted that the provided structure enables selecting, for separate input/output pads, separate triggering thresholds, by providing separate values for resistors Rd1, Rd2, Rd3. A higher resistance will induce a higher triggering threshold, and vice versa.

Figure 1:
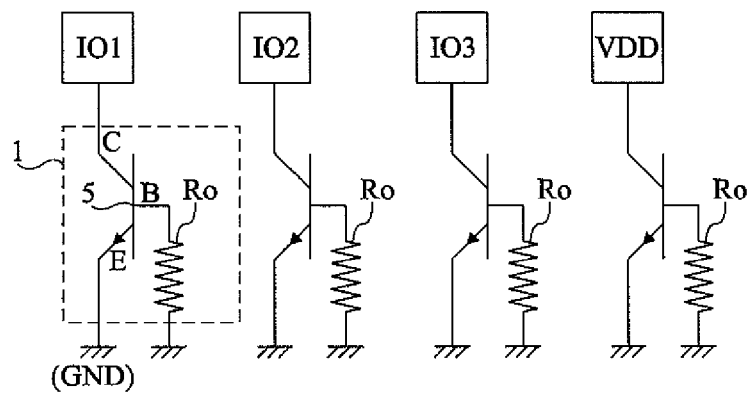
FIG. 1, previously described, shows the electric diagram of a protection based on bipolar transistors.
Figure 3A:
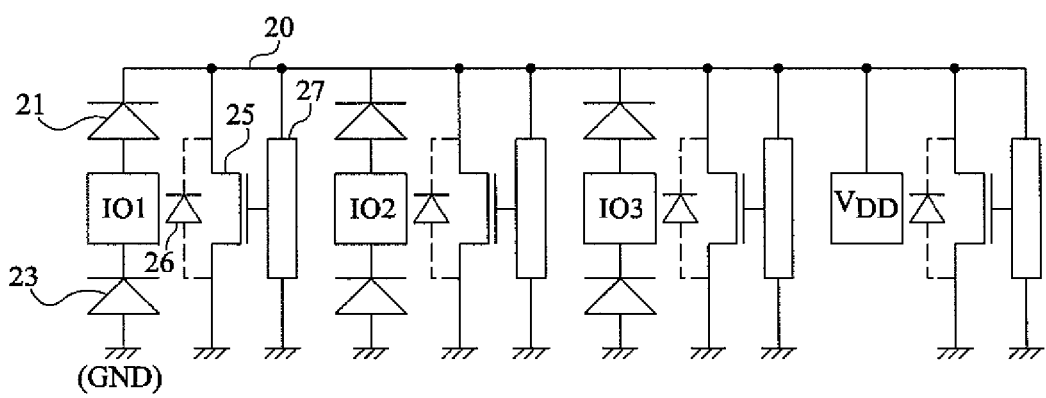
FIG. 3A, previously described, shows another example of a protection structure.
Figure 3B:
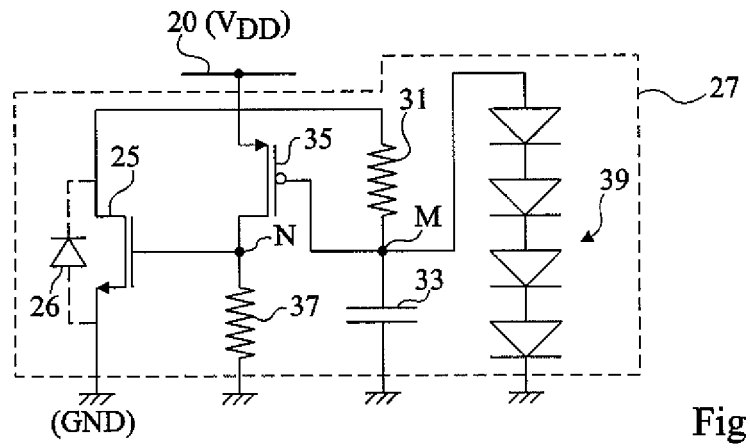
FIG. 3B, previously described, is a more detailed electric diagram of an element of the protection structure of FIG. 3A.

Another advantage of the provided protection structure is that it takes up a silicon surface area which is much smaller than the surface area taken up by protection structures with bipolar transistors of the type described in relation with FIG. 1 and by protection structures with MOS transistors and diodes of the type described in relation with FIGS. 2B and 2A. Indeed, for identical current drain-off possibilities, thyristors 43 of the provided structure have much smaller dimensions than the bipolar transistors of FIG. 1. Further, while the structure described in relation with FIGS. 3A and 3B provides a large number of protection MOS transistors between the high power supply rail and the ground, the provided structure provides a single one.

Due to its small size, the provided structure has low stray capacitances and small leakage currents, in normal operation, with respect to existing protection structures with bipolar transistors or with MOS transistors and diodes.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit protected against electrostatic discharges, this integrated circuit comprising:
   input/output pads and first and second power supply rails;
   a plurality of thyristors forward-connected between the input/output pads and the second rail, each thyristor comprising, between its anode gate and its anode, a first resistor;
   between each thyristor and the first rail, a diode having its anode directly connected to the anode gate of the thyristor and having its cathode connected to the first rail via a series-connected second resistor, wherein a resistance value of the second resistor determines a triggering voltage of its corresponding thyristor; and
   a triggering device capable of letting through a current between the first and second rails when a positive overvoltage occurs between these rails.

2. The integrated circuit of claim 1, wherein the triggering device comprises an N-channel MOS transistor having its drain connected to the first rail and having its source connected to the second rail, and an overvoltage detection circuit capable of providing a triggering signal to this transistor.

3. The integrated circuit of claim 2, wherein the overvoltage detection circuit comprises:
   an edge detector formed of a resistor in series with a capacitor, connected between the first and second power supply rails;
   a P-channel MOS transistor having its source connected to the first rail and having its drain connected to the second rail via a resistor, the gate of this transistor being connected to the node between the resistor and the capacitor of the edge detector, and the gate of the N-channel MOS transistor being connected to the drain of the P-channel MOS transistor; and
   an assembly of diodes in series forward-connected between the gate of the P-channel MOS transistor and the second power supply rail.

4. The integrated circuit of claim 1, wherein the triggering device comprises a zener diode reverse-connected between the first and second power supply rails.

5. The integrated circuit of claim 1, wherein the triggering device comprises an NPN-type bipolar transistor connected between the first and second power supply rails.

6. The integrated circuit of claim 1, wherein the triggering device also is a protection device capable of draining off overvoltage currents between the first and second power supply rails.

7. The integrated circuit of claim 1, wherein the second resistors for adjusting the triggering, associated with separate input/output pads, have different values.

8. An integrated circuit including an electrostatic discharge circuit, the electrostatic discharge circuit comprising:
 a first thyristor forward connected between a first input/output pad of the integrated circuit and a first power supply rail;
 a first diode connected in a DC path between an anode gate of the first thyristor and a second power supply rail, wherein an anode of the first diode is directly connected to the anode gate; and
 a first resistor connected in series with the first diode between a cathode of the first diode and the second power supply rail, wherein the resistance value of the first resistor determines a triggering voltage of the first thyristor.

9. The integrated circuit of claim 8, wherein the electrostatic discharge circuit further comprises a second resistor connected between the anode gate of the first thyristor and an anode of the first thyristor.

10. The integrated circuit of claim 9, wherein the anode of the first thyristor is connected to the first input/output pad.

11. The integrated circuit of claim 8, wherein a cathode of the first diode couples to the second power supply rail via the first resistor.

12. The integrated circuit of claim 8, wherein the first resistor is selected to provide a predetermined trigger point of the first thyristor.

13. The integrated circuit of claim 8, further comprising a triggering device configured to shunt current between the first and second power supply rails when a positive overvoltage occurs between these rails.

14. The integrated circuit of claim 13, wherein the triggering device comprises a MOS transistor and an overvoltage detection circuit configured to provide a triggering signal to a gate of the MOS transistor.

15. The integrated circuit of claim 14, further comprising a second diode connected between first and second current carrying terminals of the MOS transistor.

16. The integrated circuit of claim 13, wherein the triggering device comprises a zener diode.

17. The integrated circuit of claim 13, further comprising:
 a second thyristor forward connected between a second input/output pad of the integrated circuit and the first power supply rail;
 a second diode connected in a DC path between an anode gate of the second thyristor and the second power supply rail; and
 a third resistor connected in series with the second diode, wherein a value of the third resistor is different than a value of the first resistor.

18. A method for protecting an integrated circuit from overvoltages, the method comprising:
 receiving, at an anode of a first thyristor that is forward connected between a first input/output pad of the integrated circuit and a first power supply rail, an indication of an overvoltage at the input/output pad;
 flowing first current along a DC path from the first input/output pad through a first resistor coupled between the anode of the first thyristor and an anode gate of the first thyristor;
 flowing the first current through a diode connected in series with a second resistor to a second power supply rail responsive to the overvoltage; and
 turning on the first thyristor at a first selected voltage determined at least in part by a resistance value of the second resistor.

19. The method of claim 18, further comprising:
 exceeding the first selected voltage between the anode of the first thyristor and an anode gate node of the first thyristor responsive to the flowing first current; and
 turning on the thyristor responsive to exceeding the first selected voltage.

20. The method of claim 19, wherein the first selected voltage is determined in part by values of the first and second resistors.

21. The method of claim 18, further comprising:
 sensing, with an overvoltage detection circuit, an overvoltage at the second supply rail caused by the flowing first current; and
 shunting current from the second supply rail to the first supply rail responsive to sensing the overvoltage.

22. The method of claim 21, wherein the shunting comprises triggering a gate of a MOS transistor having its current carrying terminals connected between the second supply rail and first supply rail.

* * * * *